(12) United States Patent
Huang et al.

(10) Patent No.: US 6,531,393 B2
(45) Date of Patent: Mar. 11, 2003

(54) SALICIDE INTEGRATED SOLUTION FOR EMBEDDED VIRTUAL-GROUND MEMORY

(75) Inventors: Chong-Jen Huang, Hsinchu (TW); Hsin-Huei Chen, Hsinchu (TW); Kuang-Wen Liu, Hsinchu (TW); Chih-Hao Wang, Hsinchu (TW)

(73) Assignee: Macronix International, Col, Ltd. (TW)

( * ) Notice: Subject to any disclaimer, the term of this patent is extended or adjusted under 35 U.S.C. 154(b) by 0 days.

(21) Appl. No.: 09/760,597

(22) Filed: Jan. 16, 2001

(65) Prior Publication Data

US 2002/0094676 A1 Jul. 18, 2002

(51) Int. Cl.[7] .............................................. H01L 21/44
(52) U.S. Cl. ...................... 438/655; 438/283; 438/587; 438/595; 438/664
(58) Field of Search ....................... 438/157, 175–176, 438/195, 282–283, 289, 587, 592, 595, 655, 664, 682–683

(56) References Cited

U.S. PATENT DOCUMENTS 6,001,721 A * 12/1999 Huang ......................... 438/586
6,025,267 A * 2/2000 Pey et al. .................... 438/299
6,096,609 A * 8/2000 Kim et al. ................... 438/281
6,207,492 B1 * 3/2001 Tzeng et al. ................. 438/241
6,414,375 B1 * 7/2002 Ohkawa ....................... 257/637

FOREIGN PATENT DOCUMENTS

JP         2000307086 A  * 11/2000

* cited by examiner

Primary Examiner—Amir Zarabian
Assistant Examiner—Jamie L. Brophy
(74) Attorney, Agent, or Firm—Powell Goldstein Frazer & Murphy LLP

(57) ABSTRACT

A salicide integrate solution for embedded virtual-ground memory of the present invention provides a controlled distance between poly gates. In this way, the spacers formed on the sidewalls of the poly gates become self fill-upon spacers, and the surface of the substrate is not exposed. Thus, the salicides will not be formed on the surface of the substrate causing the connection of the buried diffusion regions. Moreover, the present invention provides two dummy poly gates located on the outside of the poly gates, so that the buried diffusion regions on the surface of the embedded virtual-ground memory are covered by the poly gates and self fill-up spacer. Utilizing the present invention, the process of forming salicides on the memory cell region and the peripheral logic region can be integrated together.

7 Claims, 3 Drawing Sheets

US 6,531,393 B2

SALICIDE INTEGRATED SOLUTION FOR EMBEDDED VIRTUAL-GROUND MEMORY

FIELD OF THE INVENTION

The present invention relates to a salicide integrated solution for embedded virtual-ground memory. More particularly, the present invention relates to an integrated solution for the processes of memory cell region and peripheral logic region in the embedded virtual-ground memory.

BACKGROUND OF THE INVENTION

A ROM is a nonvolatile memory device in which stored data are not changed in a normal operation state. A ROM is classified according to the methods for storing data into the ROM. There is a mask read only memory (MROM), a programmable ROM (PROM), an electrically programmable ROM (EPROM) and an erasable and electrically programmable ROM (EEPROM).

The mask ROM is coded with its data, i.e., has the data stored in it, by using a specialized mask (representing particular requirement of a user) during the fabrication process. Data stored in a mask ROM is not able to be changed, rather it is only possible to read the data. One type of mask ROM causes a predetermined transistor to have a status that differs from other transistors by implanting impurity ions, so that a datum is coded. That is, the mask ROM causes a predetermined transistor to have an OFF state by implanting impurity ions during fabrication. Transistors for which impurity ions are not implanted during fabrication have an ON state, and vice versa. Therefore, the data are coded.

As illustrated in FIG. 1, a conventional mask ROM has a buried oxide layer 19 which is perpendicular to a wordline of poly gate 23. A high concentration buried diffusion region made up of a common source and a drain region is provided, and is used for a bit line that is formed under the buried oxide layer 19, so that the word line is perpendicular to the bit line. Accordingly, the word line and the bit line intersect and form transistors. The first and second transistor channels 27 and 29 are formed between the buried diffusion regions under the buried oxide layer 19, overlapping with the poly gate 23. The transistor T1 having the first channel 27 that is coated with P conductivity type material maintains the OFF state, and the other transistor T2 having the uncoated second channel 29 is not programmed and maintains the ON state.

As illustrated in FIG. 2, a cross-sectional view taken along section line 11-11'of FIG. 1 is shown. According to this view, a gate oxide layer 17 and a buried oxide layer 19 are formed on a P type semiconductor substrate 11. The buried oxide layer 19 is thicker than the gate oxide layer 17. A buried diffusion region 21 having N type impurity ions is formed under the buried oxide layer 19. The buried diffusion region 21 is the common source/drain of the transistors, and is used for a bit line. A poly gate 23, perpendicular to the buried diffusion region 21, is formed on the gate oxide layer 17. A portion of the semiconductor 11, positioned opposite to the poly gate 23 becomes the first and second channels 27 and 29. The transistor T1, having the first channel 27, is made of the P type impurity ions and maintains the OFF state. The transistor T2, having the second channel 29, maintains the ON state.

A process for forming the above-described conventional mask ROM will now be described with reference to FIGS. 3A–3D.

As illustrated in FIG. 3A, a first photosensitive layer 13 is deposited on the semiconductor substrate 11, which is made of P type silicon. The photosensitive layer 13 is exposed to light, then developed and patterned to expose selected portions of the semiconductor substrate 11. An N type impurity ion such as As or P is heavily doped in the semiconductor substrate 11, using the first photosensitive layer 13 as a mask, to form an ion implanted region 15.

As illustrated in FIG. 3B, the first photosensitive layer 13 is eliminated. The surface of the semiconductor substrate 11 is implanted with impurities during a thermal oxidation process, and the gate oxide layer 17 is formed on a portion where ions are not implanted. The rate of oxidation in the portion of the semiconductor substrate 11, where the ion implanted region 15 is formed, is 15 to 20 times fastener than that of the portion where ions are not implanted due to a lattice damage, enabling the formation of a thick buried oxide layer 19. During thermal oxidation, impurity ions in the ion implanted region 15 are activated, so that they function as the common source and drain region. The buried diffusion region 21 is used for the bit line.

As illustrated in FIG. 3C, impurity ions such as polycrystal silicon or CoSi are doped on the gate oxide layer 17 and the buried oxide layer 19 using chemical vapor deposition (CVD). They are patterned to be perpendicular to the buried diffusion region 21 in a photolithography method, effectively forming a wordline poly gate 23. Therefore, a transistor is formed whose channel is the portion corresponding to the poly gate 23 between the buried diffusion regions 21 of the semiconductor substrate 11. The second photosensitive layer 24 is deposited on the overall surface of the substrate. It is exposed to light, developed and patterned to expose the predetermined transistor. Impurity ions such as B or $BF_2$ are heavily implanted in the substrate to form the ion implanted region 25, using the second photosensitive layer 24 as a mask.

As illustrated in FIG. 3D, the second photosensitive layer 24 is eliminated. The impurity ions in the ion implanted region 25 are heat-treated and diffused to form the first channel 27, where P type impurity ions are heavily doped. The channel where the P type impurity ions are not doped becomes the second channel 29. The transistor TI that is used for the first channel 27 is coded, and the other transistor T2 that is used for the second channel 29 is not coded.

Finally, the spacers comprising the material of TEOS and SiN are formed on the sidewall of the poly gate 23. In order to obtain a low resistivity of the poly gate 23, the salicides are formed on the top portion of the poly gate 23. Generally speaking, the process of forming the silicide is to deposit titanium on the poly gate 23, and than treat it at a high temperature, such as with rapid thermal processing. After etching the titanium remaining on the poly gates 23, the salicides of $TiSi_2$ are then obtained.

However, the titanium can react with silicon or polysilicon to form the salicides. In order to protect the surface of the substrate between poly gates, which will cause the connection of the buried diffusion regions by the salicides causing the damages of the mask ROM.

According to the salicide process described above, the conventional processes of the memory cell region and the peripheral logic region in the Mask ROM have to be seperated, consequently increasing the cost and processes in fabricating the Mask ROM.

SUMMARY OF THE INVENTION

It is therefore an object of this invention to provide a salicide integrated solution for embedded virtual-ground memory. The present invention provides the controlled distance between poly gates. In this way, the spacers formed on the side wall of the poly gates become self fill-upon spacers, and the surface of the substrate is not exposed. Thus, the salicides will not be formed on the surface of the substrate causing the connection of the buried diffusion regions.

It is another object of this invention to provide a salicide integrated solution for embedded virtual-ground memory. The present invention provides two dummy poly gates located on the outside poly gates, so that the buried diffusion regions on the surface of the embedded virtual-ground memory are covered by the poly gates and self fill-up spacer. Utilizing the present invention, the process of forming salicides on the memory cell region and the peripheral logic region can be integrated.

It is another object of this invention to provide a salicide integrated solution for embedded virtual-ground memory. Utilizing the present invention, the process of forming salicides on the memory cell region and the peripheral logic region can be integrated.

In accordance with all aspects of this invention, the invention provides a method for forming a plurality of salicides on an embedded virtual-ground memory, comprising the steps of: providing a memory substrate, in which a plurality of buried diffusion regions have been formed on a surface of the memory substrate, forming a plurality of poly gates on the surface and being perpendicular to the buried diffusion regions, forming a plurality of self fill-up spacers on a plurality of the sidewalls of the poly gates, and forming a plurality of salicides on the top portion of said poly gates.

In accordance with all aspects of this invention, this invention provides a method for forming a plurality of salicides on an embedded virtual-ground memory, comprising the steps of: providing a memory substrate, in which a plurality of buried diffusion regions have been formed on a surface of the memory substrate, forming a plurality of poly gates, including two dummy poly gates located on the outside of said poly gates, on the surface and being perpendicular to the buried diffusion regions, forming a material including a TEOS and a SiN deposited on the poly gates and the surface, etching the material to form a plurality of self fill-up spacers on a plurality of the sidewalls of the poly gates, and forming a plurality of salicides on the top portion of the poly gates.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
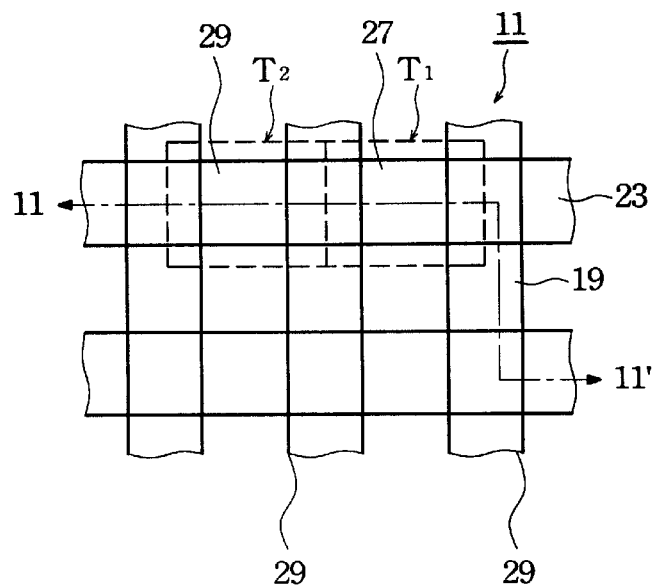
FIG. 1 is a top view of a conventional mask ROM.
Figure 2:
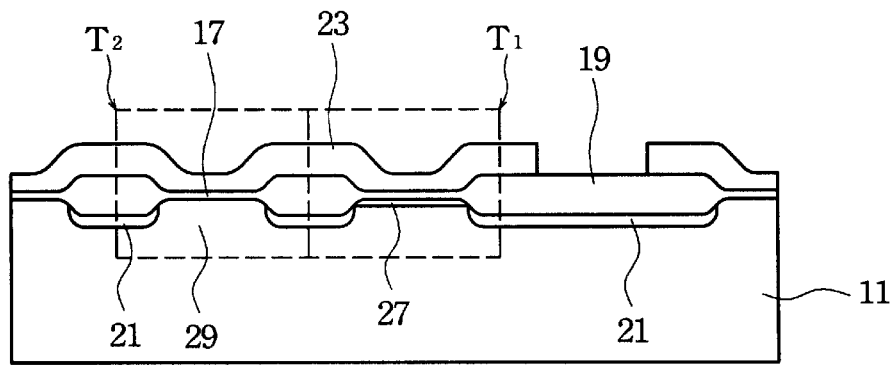
FIG. 2 is a sectional view taken along section line 11—11'of FIG. 1.
Figure 3:
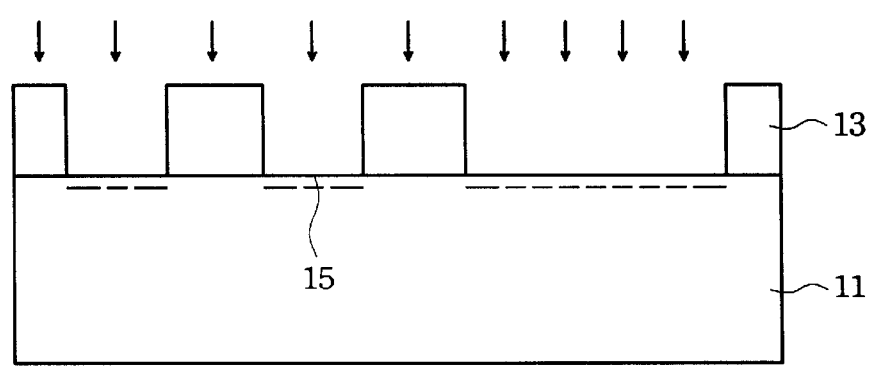
FIGS. 3A to 3D illustrate the fabricational procedures of a conventional MROM.
Figure 3:
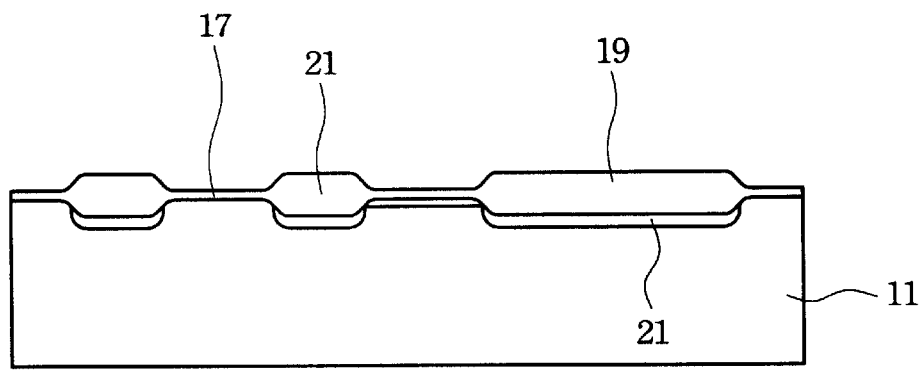
Figure 3:
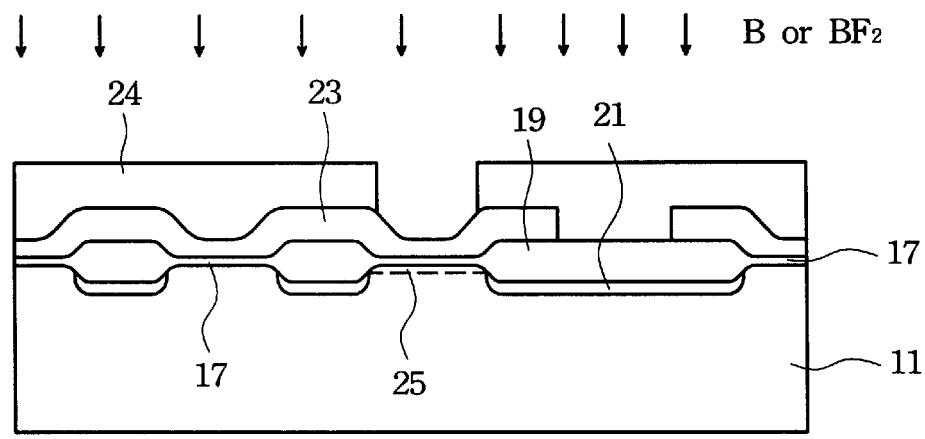
Figure 3:
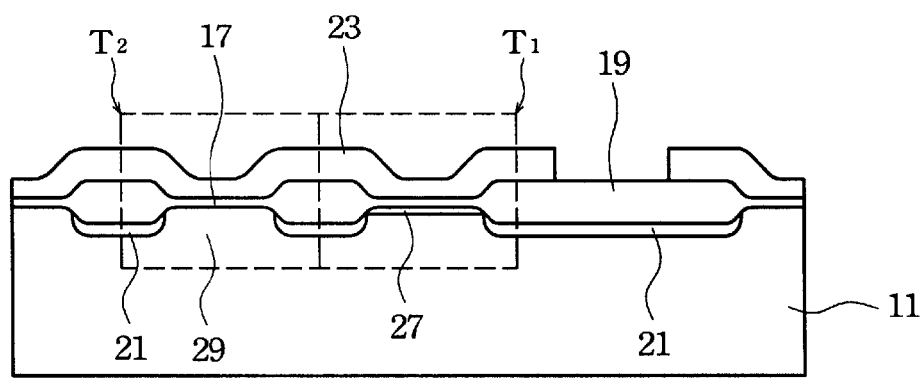
Figure 4A:
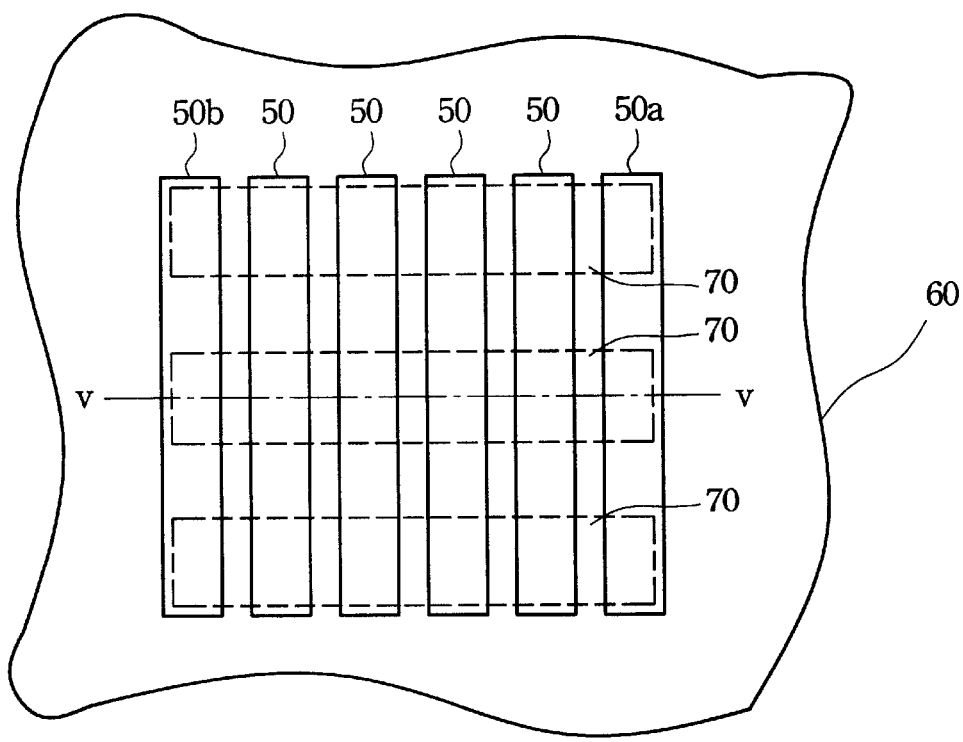
FIG. 4A shows the top view of the embedded virtual-ground having buried diffusion regions on the surface of the substrate.
Figure 4B:
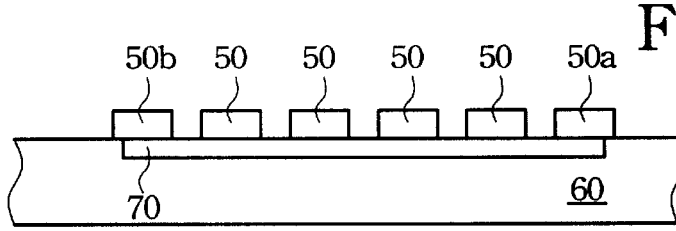
FIG. 4B shows the cross-sectional view taken along line V—V of FIG. 4A.

Referring to FIG. 4A, the schematic diagram shows the top view of the embedded virtual-ground having buried diffusion regions on the surface of the substrate. FIG. 4B shows the cross sectional view taken along line V—V of FIG. 4A. Due the progress of semiconductor processes, the density and the volume of the embedded virtual-ground memory can be increased by controlling the distance between the poly gates 50. According to the embodiment of the present invention, the distance between the poly gates 50 is controlled under 0.24 micro-meter, between 0.16 and 0.24 micro-meter, for example. The poly gates 50, which include two dummy poly gates 50a and 50b located on the outside of the poly gates 50, are formed on the surface of the embedded virtual-ground memory substrate 60, and are perpendicular to the buried diffusion regions 70. The functions of the dummy poly gates 50a and 50b are described as follows.

Figure 5A:
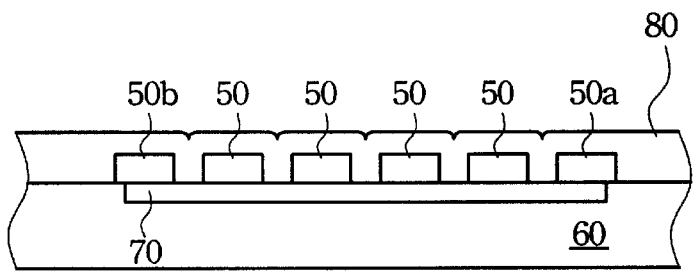
FIGS. 5A and 5B illustrate the cross-sectional views showing the processes involved in forming the self fill-up spacers of the present invention.
Figure 5B:
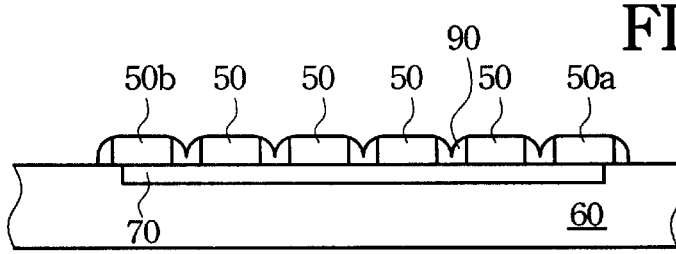

Referring to FIGS. 5A and 5B, the cross sectional views show the processes of forming the self fill-up spacers of the present invention. Using the CVD process, the material 80 of TEOS and SiN is deposited on the poly gates 50 and on the surface of the substrate 60. Then, the anisotropic etching process is carried out. By controlling the etching process, the self fill-up spacers 90 are formed on the sidewall of the poly gates 50 and dummy poly gates 50a and 50b. The surfaces of the substrate 60 between the poly gates 50 are then protected. Also, the function of the two dummy poly gates 50a and 50b are to ensure that the remaining buried diffusion regions 70 are covered. Subsequently, all the buried diffusion regions 70 on the surface of the embedded virtual-ground memory substrate 60 are not exposed.

After that, the processes of forming the salicides are processed, and the conventional problem, which causes a connection between the poly gates, is solved. Utilizing the processes of the present invention, the processes of forming salicides on the memory cell region and the peripheral logic region can be integrated together.

It is therefore an advantage of this invention to provide a salicide integrate solution for embedded virtual-ground memory. The present invention provides a controlled distance between poly gates. The spacers formed on the side wall of the poly gates become self fill-upon spacers, and the surface of the substrate is not exposed. Thus, the salicides will not be formed on the surface of the substrate causing the connection of the buried diffusion regions.

It is another advantage of this invention to provide a salicide integrate solution for embedded virtual-ground memory. The present invention provides two dummy poly gates located on the outside poly gates, so that the buried diffusion regions on the surface of the embedded virtual-ground memory are covered by the poly gates and self fill-up spacer. Utilizing the present invention, the process of forming salicides on the memory cell region and the peripheral logic region can be integrated.

It is another advantage of this invention to provide a salicide integrate solution for embedded virtual-ground memory. Utilizing the present invention, the process of forming salicides on the memory cell region and the peripheral logic region can be integrated.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method for forming a plurality of salicides on an embedded virtual-ground memory, comprising the steps of:

providing an embedded virtual-ground memory substrate, which a plurality of buried diffusion regions have been formed on a surface of said embedded virtual-ground memory substrate;

forming a plurality of poly gates, which include two dummy poly gates located on the outside of said poly gates, on said surface, and perpendicular to said buried diffusion regions;

forming a material including a TEOS and a SiN deposited on said poly gates and said surface;

etching said material to form a plurality of self fill-up spacers on a plurality of sidewalls of said poly gates; and forming a plurality of salicides on the top portion of said poly gates.

2. The method according to claim 1, wherein a distance between said poly gates is under 0.24 micro-meter.

3. The method according to claim 1, wherein a distance between said poly gates is between 0.16 and 0.24 micrometer.

4. The method according to claim 1, wherein said buried diffusion regions are covered by said poly gates and said self fill-up spacers.

5. The method according to claim 1, wherein a CVD is used to form said material on said poly gates and said surface.

6. The method according to claim 1, wherein forming said salicides on the top portion comprises the steps of:

forming titanium on said poly gates and said self fill-up spacers;

processing an annealing treatment; and etching said titanium remaining on said poly gates and said self fill-up spacers.

7. The method according to claim 6, wherein processing said annealing treatment is a rapid thermal processing (RTP).

* * * * *